United States Patent
Karasaki et al.

(10) Patent No.: US 10,147,646 B2
(45) Date of Patent: Dec. 4, 2018

(54) MANUFACTURING PROCESS OF ELEMENT CHIP

(71) Applicant: Panasonic Intellectual Property Management Co., Ltd., Osaka (JP)

(72) Inventors: Hidehiko Karasaki, Osaka (JP); Hidefumi Saeki, Osaka (JP); Atsushi Harikai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/811,733

(22) Filed: Nov. 14, 2017

(65) Prior Publication Data

US 2018/0174908 A1 Jun. 21, 2018

(30) Foreign Application Priority Data

Dec. 15, 2016 (JP) ................................ 2016-243325

(51) Int. Cl.
*H01L 21/78* (2006.01)
*H01L 21/268* (2006.01)

(52) U.S. Cl.
CPC .......... *H01L 21/78* (2013.01); *H01L 21/2686* (2013.01)

(58) Field of Classification Search
None
See application file for complete search history.

(56) References Cited

U.S. PATENT DOCUMENTS

| 2005/0035100 | A1 | 2/2005 | Genda | |
|---|---|---|---|---|
| 2012/0108035 | A1* | 5/2012 | Kim | B23K 26/0057 438/463 |
| 2013/0178006 | A1* | 7/2013 | Kim | H01L 21/78 438/33 |
| 2016/0133519 | A1* | 5/2016 | Holden | H01L 21/78 438/462 |
| 2018/0012787 | A1* | 1/2018 | Oka | H01L 21/302 |
| 2018/0158691 | A1* | 6/2018 | Yokoi | H01L 21/304 |
| 2018/0185964 | A1* | 7/2018 | Yokoi | C09J 201/00 |

FOREIGN PATENT DOCUMENTS

JP 2005-064231 A 3/2005

* cited by examiner

*Primary Examiner* — Asok K Sarkar
(74) *Attorney, Agent, or Firm* — Pearne & Gordon LLP (57) ABSTRACT

A manufacturing process of an element chip comprises a preparation step for preparing a substrate, the substrate including first and second streets crossing each other to define a plurality of element regions. Also, it comprises a first shallow-groove formation step for radiating a laser beam along the first streets to form a plurality of first shallow grooves being shallower than a thickness of the substrate, a second shallow-groove formation step for radiating the laser beam along the second streets to form a plurality of second shallow grooves being shallower than a thickness of the substrate, a first groove formation step for radiating the laser beam along the first shallow grooves to form a plurality of first grooves, and a plasma dicing step for etching the substrate along the first grooves and the second shallow grooves by a plasma exposure to dice the substrate into a plurality of element chips.

14 Claims, 5 Drawing Sheets

MANUFACTURING PROCESS OF ELEMENT CHIP

CROSS REFERENCE TO RELATED APPLICATION

The present application is based on and claims priority under 35 U.S.C. § 119 with respect to the Japanese Patent Application No. 2016-243325, filed on Dec. 15, 2016, of which entire content is incorporated herein by reference into the present application.

TECHNICAL FIELD

The present invention relates to a manufacturing process of an element chip, and in particular to the manufacturing process of the element chip, which includes a laser-scribing step and a plasma-dicing step.

BACKGROUND

A plurality of the element chips are manufactured by dicing a substrate including a semiconductor layer and a protective layer. The substrate generally contains a plurality of element regions and a plurality of streets defining each of the element regions, in which a plurality of the element chips are manufactured by dicing the substrate with the streets removed. Patent Document 1 (JP 2005-064231 A or US 2005/0035100 A1) discloses a dicing process of the substrate by scribing (laser-scribing) a shallow portion of the substrate along the streets by radiating a laser beam and then by cutting the rest portion through the substrate along the streets by means of a cutting blade.

In the laser-scribing process, a pulsed laser beam is typically used to suppress a thermal impact. It has been known that when the pulsed laser beam is used in the laser-scribing process, a laser abrasion causes particulates called debris (which may be also called an undesired material) scattering from a surface of an object to be processed and again adhering on the same surface. However, when mechanically cutting the rest portion through the substrate as disclosed in Patent Document 1, the undesired material adhered on the streets cause substantially no adverse impact on a processing quality.

In the meantime, a plasma-dicing process has been recently proposed for dicing the substrate, in which the shallow portion of the substrate is scribed along the streets by the laser beam and the rest portion thereof is etched through the substrate by a plasma exposure. A source gas and a condition for generating the plasma may be selected in accordance with material and/or thickness of the object to be processed. This causes adverse impact on the processing quality with the undesired material adhered on the streets during the plasma-etching step.

SUMMARY

One aspect of the present invention relates to a manufacturing process of an element chip, which comprises a preparation step for preparing a substrate having first and second sides, the substrate including a first layer of a semiconductor layer, a second layer having an outermost protective layer, and a plurality of element regions, and a plurality of first and second streets crossing each other to define each of the element regions; a laser scribing step for radiating a laser beam to the first side along the first and second streets to form a plurality of first and second grooves along the streets, the first and second grooves being shallower than a thickness of the substrate; after the laser scribing step, a plasma dicing step for etching the rest of the substrate remaining in a direction of a depth along the first and second grooves through the substrate by a plasma exposure to the grooves to dice the substrate into a plurality of element chips each having the element region; wherein the laser scribing step includes, a first shallow-groove formation step for radiating the laser beam $N_1$ times ($N_1 \geq 1$) onto the first streets to form first shallow grooves each shallower than the first groove; after the first shallow-groove formation step, a second shallow-groove formation step for radiating the laser beam $M_1$ times ($M_1 \geq 1$) onto the second streets to form second shallow grooves each shallower than the second groove; after the second shallow-groove formation step, a second groove formation step for radiating the laser beam $M_2$ times ($M_2 \geq 1$) onto the second shallow grooves until the second grooves are formed; and after the first shallow-groove formation step, and after the second shallow-groove formation step or the second groove formation step, a first groove formation step for radiating the laser beam $N_2$ times ($N_2 \geq 1$) onto the first shallow grooves until the first grooves are formed.

DETAILED DESCRIPTION

Figure 1A:
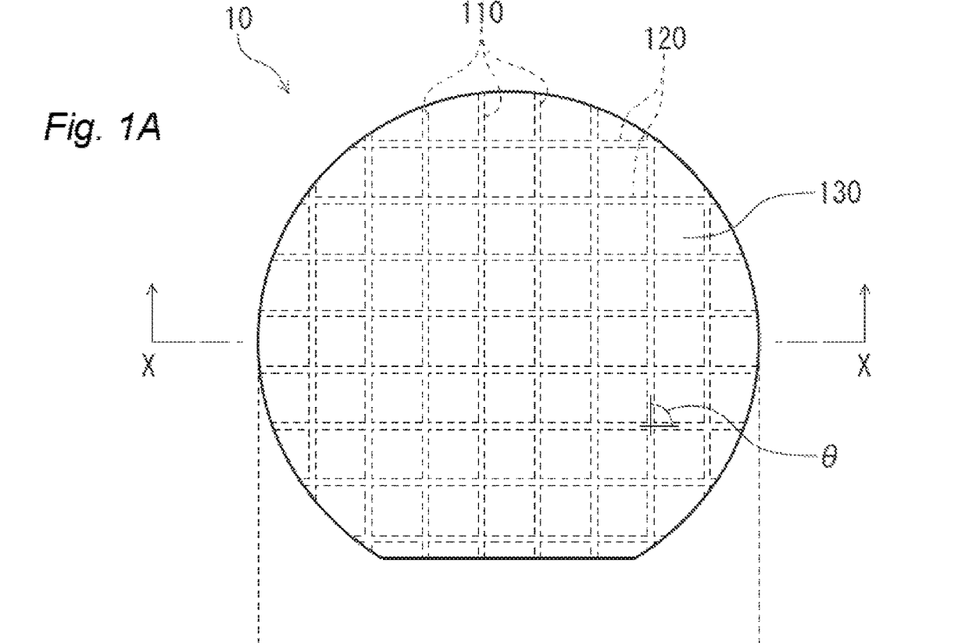
FIG. 1A is a top plan view schematically depicting a substrate as an object to be processed by an embodiment of a manufacturing process according to the present invention.
Figure 1B:
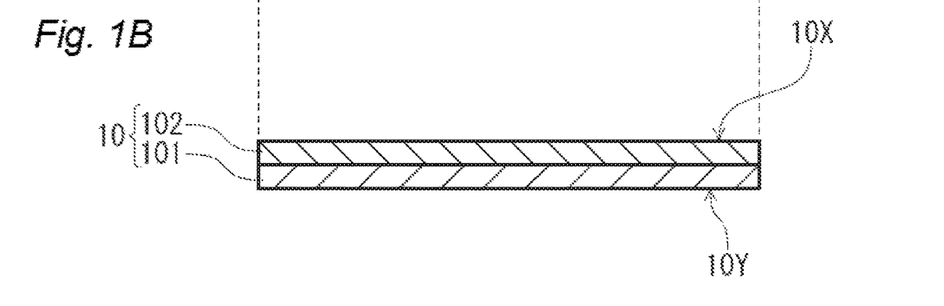
FIG. 1B is a cross-sectional view taken along a line X-X of FIG. 1A.
Figure 2A:
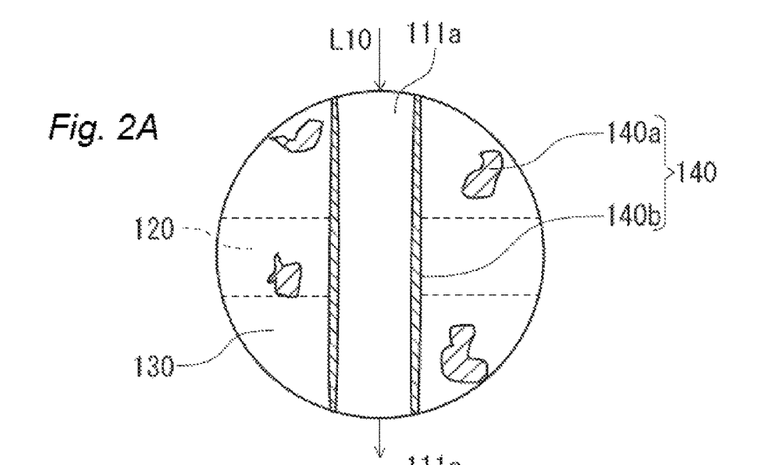
FIGS. 2A-2C are enlarged top plan views schematically depicting a portion of the substrate during a laser-scribing step of the manufacturing process according to the present invention.
Figure 2B:
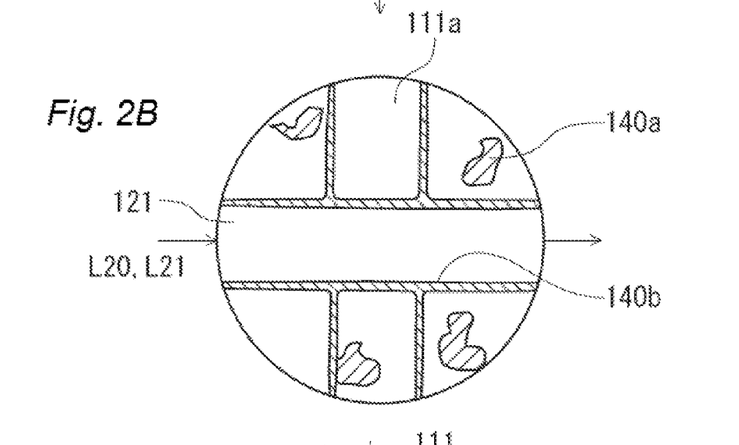
Figure 2C:
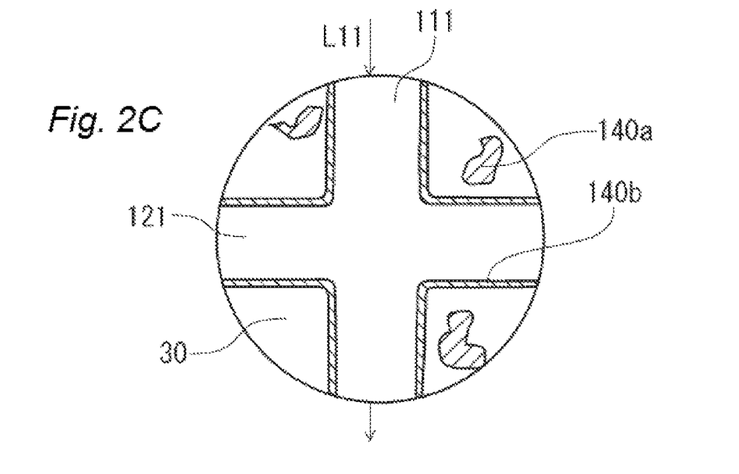

With reference to attached drawings, a manufacturing process of the present invention will be described hereinafter. FIG. 1A is a top plan view schematically depicting a substrate as an object to be processed by an embodiment of the manufacturing process, and FIG. 1B is a cross-sectional view taken along a line X-X of FIG. 1A. Also, FIGS. 2A-2C are enlarged top plan views schematically depicting a portion of the substrate during a laser-scribing step of the manufacturing process.

(1) Preparation Step Firstly, a substrate 10 as an object to be diced is prepared. The substrate 10 having a first side 10X and a second side 10Y includes a first layer 101 of a semiconductor layer, and a second layer 102 which may be a multi-layer stack containing a protective layer (not shown) on the outermost surface defining the first side 10X. Also, the substrate 10 includes a plurality of first and second streets 110, 120 crossing each other. The plurality of the first and second streets 110, 120 together define a plurality of element regions 130, in which a circuit layer (not shown)

may be formed in a form of a semiconductor circuit, an electrical element, or a MEMS.

The configuration of the first and second streets 110, 120 is not limited to a straight line and may be determined in accordance with the outline of desired element chips 30 (shown in FIG. 2C), including, e.g., a zig-zag line and a wavy line. Thus, the outline of the desired element chips 30 may be, for example, rectangular and hexagonal.

The crossing angle θ between the first and second streets 110, 120 is not limited to a right angle as shown, but may be any angles as far as the first and second streets 110, 120 define the outline of the element chips 30. For example, the crossing angle θ (θ≤180°) may be, for example, between 45° and 135°. More particularly, the crossing angle θ can be defined by the centerlines of those streets 110, 120. Thus, when the first streets 110 and/or the second streets 120 have a curved line such as a wavy line, the crossing angle θ can be determined by tangential lines at a crossing point thereof.

The widths of the streets are not limited to as shown, and may be any widths appropriately selected in accordance with the sizes of the substrate 10 and the element chips 30. For example, each of the first and second streets 110, 120 has the width between about 10 μm and about 30 μm. The widths of the first and second streets 110, 120 may be the same as or different from each other. Typically, each of the first and second streets 110, 120 is arranged in plural on the substrate 10. The pitches between the adjacent first streets 110 and between the adjacent second streets 120 are not limited to as shown, and may be any widths appropriately selected in accordance with the sizes of the substrate 10 and the element chips 30.

The first layer 101 may be a semiconductor layer made of material such as silicon (Si), gallium arsenide (GaAs), gallium nitride (GaN), and silicon carbide (SiC). The second layer 102 contains at least the protective layer (not shown) on the outermost surface defining the first side 10X. The protective layer is provided for protecting the element regions 130, which may be made of a so-called resist material such as a thermosetting resin such as polyimide, a photoresist such as a phenol resin, or a water-soluble resist such as an acrylic resin. The protective layer may be formed, for example, by preparing a sheet of resist material and laminating the sheet on the first layer 101 or on the second layer 102 prior to formation of the first layer 101, or alternatively by spraying a solution of resist material over the first layer 101 or over the second layer 102 prior to formation of the first layer 101 by means of a spin-coating or a spray-coating technique. Besides the protective layer, the second layer 102 may also contains a multilayer wiring layer (such as a stack of a low-k (low-dielectric) layer and a copper (Cu) wiring layer), a metal layer, an insulating layer of silicon dioxide ($SiO_2$), silicon nitride ($Si_3N_4$), lithium tantalate ($LiTaO_3$), or lithium niobate ($LiNbO_3$).

(2) Laser Scribing Step In the laser scribing step, a plurality of grooves shallower than a thickness of the substrate 10 are formed by radiating a laser beam to the first side 10X along or corresponding to the first streets 110 and the second streets 120. Thus, the laser scribing step forms a plurality of first grooves 111 corresponding to the first streets 110 and a plurality of second grooves 121 corresponding to the second streets 120 on the substrate 10. The first grooves 111 and the second grooves 121 have a depth which is preferably the same as the thickness of the second layer 102 of the substrate 10, for example, 80% through 120% of the thickness of the second layer 102, and more preferably 100% through 120% of the thickness of the second layer 102. As described above, most or all of the second layer 102 and a portion of the first layer 101 are removed in the laser scribing step along the first and second streets to perform a subsequent plasma dicing step in an efficient manner, thereby shortening the operation time required for the plasma dicing step. The conditions for a plasma exposure such as a source gas and voltage to be applied should be modified in accordance with the object to be etched. Therefore, the plasma etching can be effectively achieved by securely removing the second layer 102 laser which may contain various material.

Given the optical characteristics of the laser beam, typically, a laser beam is repeatedly radiated along the corresponding streets several times to form a line of the groove thereby. Also, in general, the repeated steps of the laser beam radiation are performed in series so that the operation time is reduced. In case that the first grooves 111 and the second grooves 121 crossing each other are formed, a process is adapted to radiate the laser beam repeatedly two times or more in series along the first street 110 corresponding to the first grooves 111, and then to radiate the laser beam repeatedly two times or more in series along the second street 120 corresponding to the second grooves 121.

Also, a pulsed laser beam is often used in the laser scribing step. However, the laser process using the pulsed laser beam may cause the debris scattering from the surface of the substrate 10 and again adhering onto the surface of the streets 110, 120. Also, a portion of material of the substrate 10 radiated by the laser beam may be melted to form a pair of linear banks or ridges along the edges of the streets being scribed. Thus, when the substrate 10 includes the first and second streets crossing each other, the laser scribing step along the first streets may form the ridges at crossing regions on the second streets blocking the first streets, and vice versa. Such ridges on the streets substantially deteriorate a processing quality of the plasma etching step.

To address the drawbacks, the laser scribing process of the present embodiment suggests at least two (or first and second) of individual phases or steps for radiating the laser beam to form the first grooves 111, instead of the repeated steps in series for radiating the laser beam. This laser scribing process also suggests another (or first) phase or step for radiating the laser beam to form the second grooves 121 between the two of the individual phases or steps for radiating the laser beam to form the first grooves 111. Thus, the laser scribing process includes the first phase for radiating the laser beam to form the first grooves 111, the first phase for radiating the laser beam to form the second grooves 121, and the second phase for radiating the laser beam to form the first grooves 111. It should be noted that the first phase for radiating the laser beam to form the second grooves 121 is not required to form it thoroughly. In other words, two or more individual or subsequent phases for radiating the laser beam to form the second grooves 121 may be adapted.

To this result, undesired material such as the debris and the ridges formed along the second streets 120 at the first stage for radiating the laser beam onto the first streets 110 can be removed by the radiation of the laser beam onto the second streets 120. Also, undesired material such as the debris and the ridges formed along the first streets 110 (e.g., first shallow grooves 111a as will be described herein) at the first stage for radiating the laser beam onto the second streets 120 can be removed by the second stage radiation of the laser beam to form the first grooves 111. In this case, the amount of the material to be removed by the second stage radiation of the laser beam onto the first streets 110 is reduced, so that an amount of the undesired material formed thereafter is reduced. This gives less impact on the processing quality of the subsequent plasma etching step. When two or more individual or subsequent phases for radiating the laser beam to form the second grooves 121 are adapted, the second and/or subsequent laser radiation onto the second streets 120 may be implemented after the second stage radiation of the laser beam onto the first streets 110. Similarly, in this case, the material to be removed by the second and/or subsequent stage radiation of the laser beam onto the second streets 120 is reduced, so that an amount of the undesired material formed thereafter is also reduced, giving substantially less impact on the processing quality of the subsequent plasma etching step.

Thus, the laser scribing process of the present embodiment may include a first shallow-groove formation step for forming first shallow grooves 111*a* each shallower than the first groove 111 by radiating the laser beam (referred to as "a first shallow-groove laser beam L10 herein); after the first shallow-groove formation step, a second shallow-groove formation step for forming second shallow grooves each shallower than the second groove 121 by radiating the laser beam (referred to as "a second shallow-groove laser beam L20 herein); after the second shallow-groove formation step, a second groove formation step for radiating the laser beam (referred to as "a second groove laser beam L21 herein) onto the second shallow grooves until the second grooves 121 are formed; and after the first shallow-groove formation step, and after the second shallow-groove formation step or the second groove formation step, a first groove formation step for radiating the laser beam (referred to as "a first groove laser beam L11 herein) onto the first shallow grooves 111*a* until the first grooves 111 are formed.

Referring to FIG. 2, the laser scribing process of the present embodiment will be described in detail hereinafter. (2-a) First shallow-groove formation step (FIG. 2A): The first shallow grooves 111*a* shallower than the first grooves 111 are formed by radiating the first shallow-groove laser beam L10 $N_1$ times ($N_1 \geq 1$) onto the first streets 110. During this step, the material scattering from the surface of the substrate 10 may be adhered as the debris 140*a* on the second streets 120 and/or the element regions 130. Also during this step, the material melted on the surface of the substrate 10 may form the linear banks or ridges 140*b* along the edges of the first streets 110.

The first shallow-groove laser beam L10 is radiated under a condition such that it forms the first shallow grooves 111*a* each shallower than the first groove 111. The radiation of the first shallow-groove laser beam L10 may be made once ($N_1 = 1$) or more than once ($N_1 \geq 2$). In case of $N_1 \geq 2$, the radiation of the first shallow-groove laser beam L10 may be implemented under the same or different condition. The first shallow-groove laser beam L10 may have an energy density, which is not limited to a given value, rather may be adjusted or selected appropriately in accordance with the radiation times ($N_1$) and the depth of the first shallow grooves 111*a*. In case of $N_1 \geq 2$, the radiation of the first shallow-groove laser beam L10 may be made in series, or after and before the radiation(s) of the second shallow-groove laser beam L20 on the second streets 120. In order to shorten the operation time required for the step (i.e., to improve the productivity), when $N_1 \geq 2$, the radiation of the first shallow-groove laser beam L10 is preferably made in series.

Although not limited thereto, the depth of the first shallow grooves 111*a* may be 50% or more and less than 100%, preferably 80% or more and less than 100%, and more preferably 90% or more and less than 100% of the depth of the first grooves 111 to reduce the undesired material 140 in the subsequent first groove formation step.

(2-b) Second shallow-groove formation step (FIG. 2B): Next, the second shallow grooves (not shown) shallower than the second groove 121 are formed by radiating the second shallow-groove laser beam L20 $M_1$ times ($M_1 \geq 1$) onto the second streets 120. Then, the second shallow-groove laser beam L20 is radiated $M_2$ times ($M_2 \geq 1$) onto the second streets 120 until the second grooves 121 are formed. The undesired material 140 such as the debris 140*a* and the ridges 140*b* on the second streets 120, which are formed in the first shallow-groove formation step, are removed therefrom. The debris 140*a* adhered on the element regions 130 may be removed by cleaning the substrate 10 after the laser scribing step or the plasma dicing step. Alternatively, the debris 140*a* adhered on the element regions 130 may be removed together with the protective layer by cleaning the substrate 10 with a chemical solution for dissolving the protective layer after the laser scribing step or the plasma dicing step. Also, the debris 140*a* adhered on the element regions 130 may be removed together with the protective layer by an ashing step after the plasma dicing step.

Meanwhile, radiation of the second shallow-groove laser beam L20 or the second groove laser beam L21 onto the second streets 120 may cause the debris 140*a* adhered on the first shallow grooves 111*a* and/or the ridges 140*b* formed along the edges of the second streets 120. Those undesired materials 140 may be removed during the next step, i.e., the first groove formation step.

The second shallow-groove laser beam L20 is radiated under a condition such that it forms the second shallow grooves each shallower than the second groove 121. The radiation of the second shallow-groove laser beam L20 may be made once ($M_1 = 1$) or more than once ($M_1 \geq 2$). In case of $M_1 \geq 2$, the radiation of the second shallow-groove laser beam L20 may be implemented under the same or different condition. The second shallow-groove laser beam L20 may have an energy density, which is not limited to a given value, rather may be adjusted or selected appropriately in accordance with the radiation times ($M_1$) and the depth of the second shallow grooves. In case of $M_1 \geq 2$, the radiation of the second shallow-groove laser beam L20 may be made in series, or after and before the radiation(s) of the first shallow-groove laser beam L10 on the first streets 110. In order to shorten the operation time, when $M_1 \geq 2$, the radiation of the second shallow-groove laser beam L20 is preferably made in series.

Although not limited thereto, the depth of the second shallow grooves may be 50% or more and less than 100%, preferably 80% or more and less than 100%, and more preferably 90% or more and less than 100% of the depth of the second grooves 121 to reduce the undesired material in the subsequent second groove formation step.

The second groove laser beam L21 is radiated under a condition such that it forms the second grooves 121 starting from the second shallow grooves. The radiation of the second groove laser beam L21 may be made once ($M_2 = 1$) or more than once ($M_2 \geq 2$). In order to shorten the operation time, the radiation of the second groove laser beam L21 is preferably made once ($M_2 = 1$). On the other hand, in order to facilitate removing the undesired material 140, the radiation of the second groove laser beam L21 is preferably made twice ($M_2 = 2$). In case of $M_2 \geq 2$, the radiation of the second groove laser beam L21 may be implemented under the same or different condition. The second groove laser beam L21 may have an energy density, which is not limited to a given value, rather may be adjusted or selected appropriately in accordance with the radiation times ($M_2$) and the depth of the second shallow grooves.

If a sum of $M_1$ and $M_2$ is two or more, the second shallow-groove formation step and the second groove formation step are preferably implemented sequentially. In order to shorten the operation time and to suppress the undesired material 140 formed on the grooves and element regions, it is preferable that $M_1=1$ and $M_2=1$, and the second shallow-groove formation step and the second groove formation step are implemented sequentially.

FIG. 2 B illustrates the second shallow-groove formation step and the second groove formation step being implemented sequentially to shorten the operation time. However, the sequence of those steps is not limited thereto, the second shallow-groove formation step is followed by the first groove formation step, which is in turn followed by the second groove formation step.

(2-c) First groove formation step (FIG. 2C): After the first shallow-groove formation step and after the second shallow-groove formation step or the second groove formation step (in this embodiment, after the second groove formation step), the first groove laser beam L11 is radiated $N_2$ times ($N_2 \geq 1$) onto the first shallow grooves 111a until the first grooves 111 are formed. The undesired material 140 such as the debris 140a and the ridges 140b on the first streets 110, which are formed in the second shallow-groove formation step (and the second groove formation step), are removed therefrom. Thus, the undesired material 140 on each of the streets are removed through the second shallow-groove formation step (and the second groove formation step) and the first groove formation step. This substantially improves the processing quality of the following plasma etching step. It should be noted that in the first groove formation step, as the laser beam is radiated onto the portions where the first shallow grooves 111a are already formed, the amount of the material to be removed is reduced, and thus, the amount of the undesired material 140 is also reduced, which minimizes the adverse effect on the processing accuracy of the following plasma etching step. However, as mentioned earlier, the second groove formation step may be implemented after the first groove formation step, to remove the undesired material 140 formed during the first groove formation step, if necessary.

The first groove laser beam L11 is radiated under a condition such that it forms the first grooves 111 starting from the first shallow grooves 111a. The radiation of the first groove laser beam L11 may be made once ($N_2=1$) or more than once ($N_2 \geq 2$). In order to shorten the operation time, the radiation of the first groove laser beam L11 is preferably made once ($N_2=1$). On the other hand, in order to facilitate removing the undesired material 140, the radiation of the first groove laser beam L11 is preferably made twice ($N_2=2$). In order to shorten the operation time and to suppress the undesired material 140 formed on the grooves and element regions, it is preferable that $N_1=1$ and $N_2=2$.

In case of $N_2 \geq 2$, the radiation of the first groove laser beam L11 may be implemented under the same or different condition. The first groove laser beam L11 may have an energy density, which is not limited to a given value, rather may be adjusted or selected appropriately in accordance with the radiation times ($N_2$) and the depth of the first shallow grooves 111a.

Figure 3:
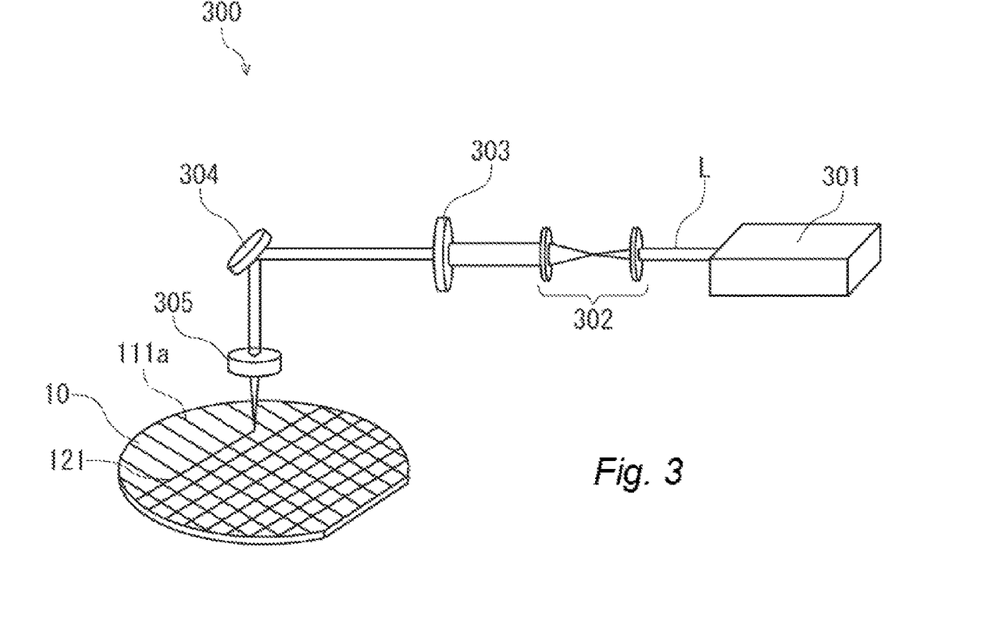
FIG. 3 is a perspective view schematically depicting a structure of a laser processing machine of the embodiment according to the present invention.

FIG. 3 is a perspective view schematically depicting a structure of a laser processing machine of the embodiment according to the present invention, which is used for the laser scribing step. The laser processing machine 300 includes a laser oscillator 301, a collimating lens 302, a mask 303, a beam bender 304, and a collecting lens 305. The laser beam L emitted from the laser oscillator 301 is irradiated onto the collimating lens 302 which adjusts a diameter of the laser beam L to a value appropriate for the mask 303. The laser beam L through the collimating lens 302 is then irradiated onto the mask 303 which shapes the laser beam to have the beam diameter corresponding to the streets on the substrate 10. The laser beam L through the mask 303 is then reflected at the beam bender 304 to the collecting lens 305 and the substrate 10.

The laser oscillator 301 may preferably be a pulsed-laser oscillator oscillating a pulsed laser beam. This is because the pulsed laser beam gives less thermal impact on the substrate 10 than the continuous-wave laser beam. The mechanism for oscillating the pulsed-wave laser beam is not limited to a particular one, and the pulsed-wave laser oscillator 301 may be adapted in any forms, which, for example, mechanically shutters the laser beam ON and OFF, controls an optical source of the laser beam L to be excited intermittently, or optically switches laser beam L output therefrom. The type of the laser oscillator 301 is not limited to a particular one, and may be, for example, a semiconductor laser oscillator using a semiconductor material as a laser media for laser oscillation, a gas laser oscillator using a gas such as carbon dioxide ($CO_2$) as the laser media, a solid laser oscillator using a solid material such as YAG as the laser media, and a fiber laser oscillator. One or more of those laser oscillators may be used individually or in combination.

Although not limited thereto, a pulse width of the laser beam L irradiated onto the substrate 10, it may preferably be 500 ns or less, more preferably 200 ns or less, in order to reduce the thermal impact thereto. Also, although not limited thereto, a peak wavelength of the laser beam L may preferably be in an ultra-violet region (having the peak wavelength between about 200 nm and about 400 nm) or a visible region having a relatively short wavelength (having the peak wavelength between about 400 nm and about 550 nm), to enhance an absorption of the laser beam L to the substrate. Furthermore, although not limited thereto, a frequency of the laser beam L may be between about 1 kHz and 200 kHz, and higher frequency allows higher rate processing.

FIG. 3 illustrates that after forming the first shallow grooves 111a, the laser beam L, that is, the second shallow-groove laser beam L20 and the second groove laser beam L21 are irradiated in series to form the second grooves 121 in one phase. The first streets (the first shallow grooves 111a) and the second streets (the second grooves 121) are formed so as to cross orthogonally each other, which produces the element chips 30 in a rectangular form after completing the plasma dicing step.

(3) Plasma Dicing Step Next, the rest of the substrate 10 remaining in a direction of its depth is etched along the first and second grooves 111, 121 through the substrate by the plasma exposure so that the substrate 10 is divided into a plurality of element chips 30 each having the element region 130. During this step, the protective layer positioned on the outermost surface of the second layer 102 serves as a mask for protecting the element regions 103 against the plasma exposure.

Figure 4A:
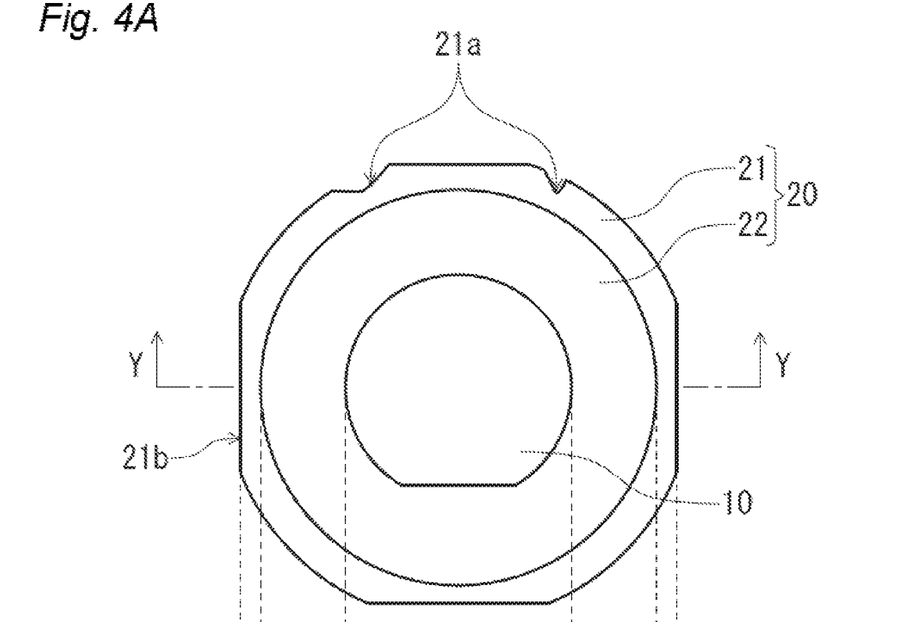
FIG. 4A is a top plan view schematically depicting a conveying carrier and the substrate held thereon.
Figure 4B:
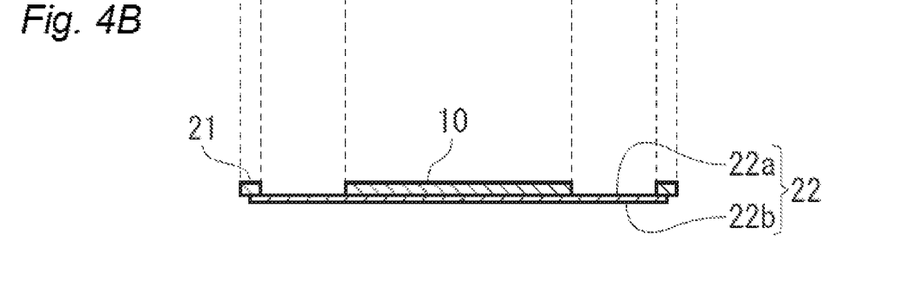
FIG. 4B is a cross-sectional view taken along a line Y-Y of FIG. 4A.

In the plasma dicing step, the substrate 10 may preferably be held on the supporting member 22 to facilitate a manipulation of the substrate 10 as illustrated in FIGS. 4A and 4B. The second side 10Y of the substrate 10 is adhered on the supporting member 22. The material of the supporting member 22 is not limited to a particular one. Since the substrate 10 being held on the supporting member 22 is diced into the element chips 30, the supporting member 22 may preferably be made from a flexible resin film for ease of picking up each of the divided element chips 30 in a subsequent die-bonding step (not described in detail). A frame 21 is also held on the supporting member 22 for easy manipulation. In the present disclosure, the supporting member 22 and the frame 21 held thereon will collectively be referred to as a conveying carrier 20. FIG. 4A is a top plan view of the conveying carrier 20 and the substrate held on the supporting member 22, and FIG. 4B is a cross-sectional view taken along a line Y-Y of FIG. 4A.

Although not limited thereto, the material of the resin film may be a thermoplastic resin including, for example, polyolefin such as polyethylene and polypropylene and polyester such as polyethylene terephthalate. The resin film may contain various additives including, for example, a rubber component for adding stretching property (for example, ethylene-propylene rubber (EPM), ethylene-propylene-diene rubber (EPDM)), a plasticizer, a softener, an antioxidant, and a conductive material. Furthermore, the thermoplastic resin may contain a functional group showing a photopolymerization reaction such as an acryl group.

The supporting member 22 includes an adhesive side 22a having an adhesive thereon and a non-adhesive side 22b having no adhesive thereon. A periphery edge on the adhesive side 22a is adhered on one side of the frame 21 and covers an opening of the frame 21. The second side 10Y of the substrate 10 is adhered and supported on the adhesive side 22a in a region exposed to the opening of the frame 21. During the plasma processing, the supporting member 22 is set on a plasma processing stage (referred to simply as a stage herein) with the non-adhesive side 22b being in contact with the stage.

The adhesive side 22a may preferably contain the adhesive material of which adhesibility is weakened with an ultra-violet beam (UV-radiation). This allows each of element chips 30 obtained by the plasma dicing step to easily be peeled off and picked up from the adhesive side 22a with the UV-radiation. The supporting member 22 may be formed, for example, by applying an UV-curing acrylic adhesive on one side of the resin film to have a thickness of 5-20 μm.

The frame 21 includes the opening having an area equal to or more than that of the whole substrate 10, and has a predetermined width and a substantially constant and thin thickness. The frame 21 has such a rigidity that it holds and conveys the supporting member 22 and the substrate 10. Although not limited thereto, the shape of the opening of the frame 21 may be a circle or a polygon such as a rectangle and a hexagon. The frame 21 may be provided with a notch 21a and a corner cut 21b for alignment thereof. The frame 21 may be made of, for example, metal such as aluminum and stainless steel, or resin.

Figure 5:
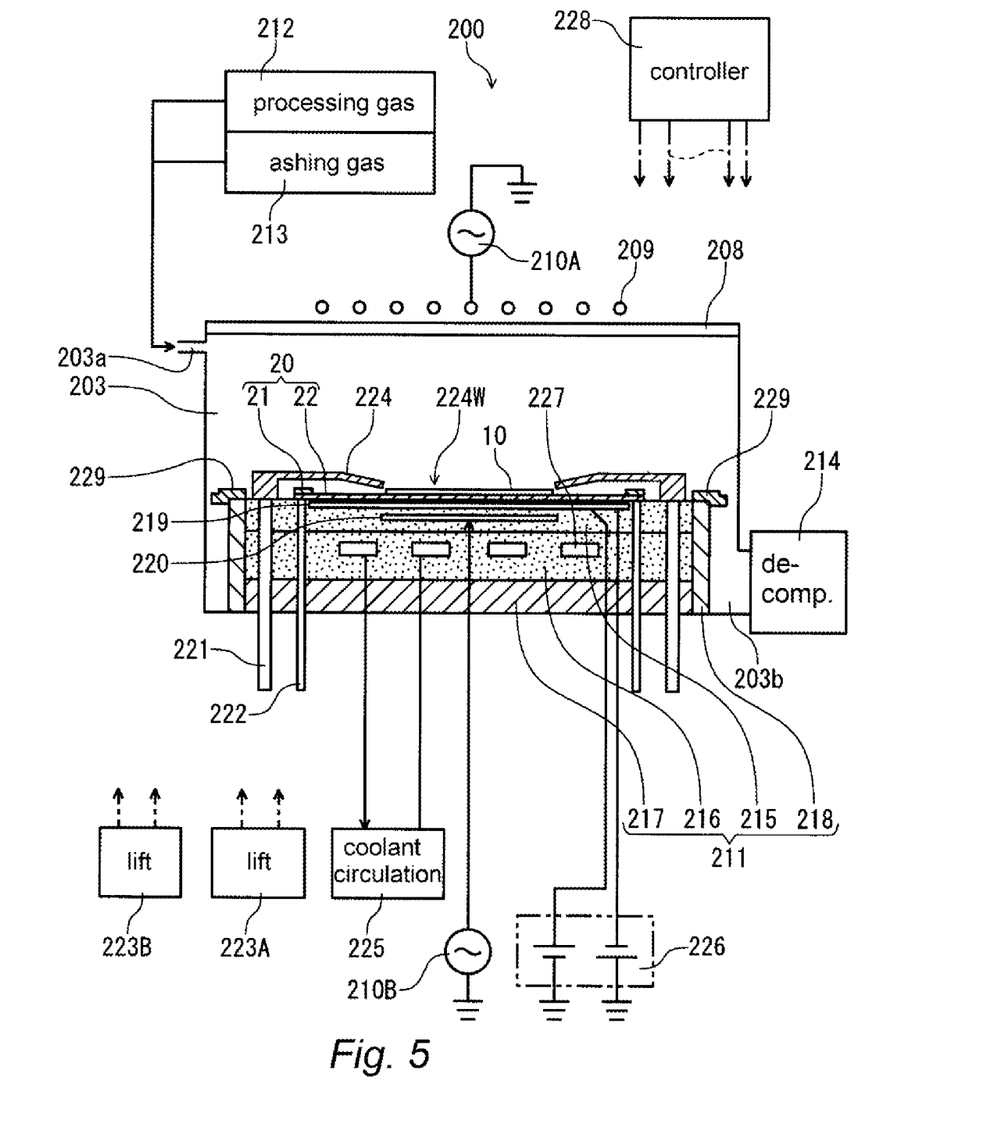
FIG. 5 is a conceptual view depicting a schematic structure in a cross section of a plasma processing apparatus of the embodiment according to the present invention.

Next, referring to FIG. 5, a plasma processing apparatus used for the plasma dicing step will be described in detail hereinafter, although it is not limited thereto. FIG. 5 depicts a schematic structure in a cross section of the plasma processing apparatus 200 of the embodiment according to the present invention.

The plasma processing apparatus 200 includes a stage 211, on which the conveying carrier 20 is seated so that the adhesive side 22a holding the substrate 10 of the supporting member 22 faces upwardly. Arranged over the stage 211 is a cover 224 which covers at least a portion of the frame 21 and the supporting member 22 and includes a window 224 W exposing at least a portion of the substrate 10.

The stage 211 and the cover 224 are received in the reaction chamber (vacuum chamber) 203. The vacuum chamber 203 is shaped in a substantially cylindrical outline having an opening at the top thereof, and the top opening is closed by a dielectric member 208 as a lid of the vacuum chamber 203. The vacuum chamber 203 may be formed of aluminum, stainless steel (SUS), or aluminum with anodic oxide coating, for example. The dielectric member 208 may be formed of yttrium oxide ($Y_2O_3$), aluminum nitride (AlN), alumina ($Al_2O_3$), or quartz ($SiO_2$), for example. Arranged on or above the dielectric member 208 is an antenna 209 performing as a top electrode. The antenna 209 is electrically connected to a first high-frequency power source 210A. The stage 211 is positioned at the bottom in the vacuum chamber 203.

The vacuum chamber 203 is provided with a gas inlet 203a for introducing a gas and a gas outlet 203b for exhausting a gas. The inlet 203a is configured to be connected selectively to one of a material gas source (a processing gas source) 212 and an ashing gas source 213 through a conduit. The outlet 203b is connected to a decompressing mechanism 214 having a vacuum pump for exhausting a gas within the vacuum chamber 203 and decompressing it.

The stage 211 includes a substantially circular electrode layer 215, a circular metal layer 216, and a base member 217 supporting the electrode layer 215 and the metal layer 216. The stage 211 also includes a peripheral member 218 surrounding the electrode layer 215, the metal layer 216, and the base member 217. The peripheral member 218 is formed of a metal having a conductivity and an etching resistance for protecting the electrode layer 215, the metal layer 216, and the base member 217 from the plasma exposure. Provided on an upper surface of the peripheral member 218 is an annular circumferential ring 229 for protecting it from the plasma exposure. The electrode layer 215 and the circumferential ring 229 may be formed of the dielectric material as listed above.

Arranged within the electrode layer 115 are an electrode 219 (referred to as an electrostatic chuck (ESC) electrode) composing an electrostatic chucking mechanism and a high-frequency electrode 220 that is connected to a second high-frequency power source 210B. The ESC electrode 219 is electrically connected to a DC power source 226. The electrostatic chucking mechanism is composed of the ESC electrode 219 and the DC power source 226.

The metal layer 216 may be formed of aluminum with an anodic oxidation coating, for example. The metal layer 216 contains a coolant channel 227 configured to cool the stage 211. Cooling the stage 211 causes the supporting member 22 on the stage 211 to be cooled down. Also, the cover 224 whose portion contacts with the stage 211 is also cooled down. This protects the substrate 10 and supporting member 22 from a damage due to heat applied during the plasma processing step. A coolant in the coolant channel 227 is circulated by a coolant circulation apparatus 225.

Provided around the peripheral portion of the stage 211 is a plurality of supporting rods 222 extending therethrough. Each of the supporting rods 222 supports the frame 21. The supporting rods 222 are driven by a lifting mechanism 223A to move upward and downward. The conveying carrier 20 is delivered into the vacuum chamber 203, and set on the supporting rods 222 raised at a given level. The supporting rods 222 are lowered with the top surface being flush with or lower than the stage 211, which sets the conveying carrier 20 on the stage 211 at a predetermined position thereof.

Also, a plurality of lifting rods 221 are coupled to the peripheral edge of the cover 224 for moving it upward and downward. The lifting rods 221 are driven by another lifting mechanism 223B. The operation of the lifting mechanisms 223A, 223B are controlled independently each other.

The controller 228 controls operations of the plasma processing apparatus 200 including the first high-frequency power source 210A, the second high-frequency power source 210B, the processing gas source 212, the ashing gas source 213, the decompressing mechanism 214, the coolant circulation apparatus 225, the lifting mechanisms 223A, 223B, and the electrostatic chucking mechanism.

The plasma atmosphere is generated under an etching condition such that the rest (typically, the first layer 101) of the substrate 10 is etched. The etching condition may be determined appropriately in accordance with the material of the first layer 101. When the first layer 101 is made of silicon, so-called a bosch process can be used to etch the first layer 101 along each of the streets (or grooves). In the bosch process, a series of steps including a step for depositing a protective layer, a step for etching the deposited or protective layer, and a step for etching the silicon substrate are repeatedly performed so as to deeply dig each of the grooves in a thickness direction.

In the step for depositing the protective layer, for example, while the vacuum chamber 203 may be supplied with the source gas of $C_4H_8$ at a rate of 150-250 sccm to have the pressure controlled between 15-25 Pa, the antenna 209 may be applied with power of 1500-2500 W from the high-frequency source 210A, and the high-frequency electrode 220 may be applied with power of 0 W from the high-frequency source 210B, for the processing time of 5-15 seconds.

In the step for etching the protective layer, for example, while the vacuum chamber 203 may be supplied with the source gas of $SF_6$ at a rate of 200-400 sccm to have the pressure controlled between 5-15 Pa, the antenna 109 may be applied with power of 1500-2500 W from the high-frequency source 210A, and the high-frequency electrode 120 may be applied with power of 100-300 W from the high-frequency source 210B, for the processing time of 2-10 seconds.

In the step for etching the silicon substrate, for example, while the vacuum chamber 203 may be supplied with the source gas of $SF_6$ at a rate of 200-400 sccm to have the pressure controlled between 5-15 Pa, the antenna 209 may be applied with power of 1500-2500 W from the high-frequency source 210A, and the high-frequency electrode 220 may be applied with power of 50-200 W from the high-frequency source 210B, for the processing time of 10-20 seconds.

Under the aforementioned conditions, the step for depositing the protective layer, the step for etching the deposited or protective layer, and the step for etching the silicon substrate may be repeatedly performed so as to deeply dig each of the grooves in a thickness direction at a rate of 10 μm per minute. When generating the plasma atmosphere in the vacuum chamber 203, several types of the source gases may be used. In this instance, several types of the source gases may be introduced into the vacuum chamber 203 with a time lag therebetween, or may be mixed and then introduced into the vacuum chamber 203.

As described above, while the substrate 10 is held on the supporting member 22, it is divided into a plurality of element chips 30 each having the element region 130. After the plasma dicing step, the plurality of the element chips 30 being held on the supporting member 22 are delivered to a pick-up step. In the pick-up step, each of the plurality of the element chips 30 is peeled off the supporting member 22 to obtain the independent element chip 30.

After the plasma dicing process, the protective layer remining on the element chips 30 may be removed by the ashing or cleaning step. This step also removes the debris 140a on the protective layer in the element regions adhered during the laser scribing step.

[Reference Numerals] 10: substrate, 10X: first side, 101: first layer, 102: second layer, 10Y: second side, 110: first street, 111: first groove, 111a: first shallow-groove, 120: second street, 121: second groove, 130: element region, 140: undesired material, 140a: debris, 140b: ridge, 20: conveying carrier, 21: frame, 21a: notch, 21b: corner cut, 22: supporting member, 22a: adhesive side, 22b: non-adhesive side, 30: element chip, 200: plasma processing apparatus, 203: vacuum chamber, 203a: gas inlet, 203b: gas outlet, 208: dielectric member, 209: antenna, 210A: first high-frequency power source, 210B: second high-frequency power source, 211: stage, 212: processing gas source, 213: ashing gas source, 214: decompressing mechanism, 215: electrode layer, 216: metal layer, 217: base member, 218: peripheral member, 219: ESC electrode, 220: high-frequency electrode, 221: lifting rod, 222: supporting rod, 223A, 223B: lifting mechanism, 224: cover, 224W: window, 225: coolant circulation apparatus, 226: DC power source, 227: coolant channel, 228: controller, 229: circumferential ring, 300: laser processing machine, 301: laser oscillator, 302: collimating lens, 303: mask, 304: beam bender, 305: collecting lens

What is claimed is:

1. A manufacturing process of an element chip, comprising:

a preparation step for preparing a substrate having first and second sides, the substrate including a first layer of a semiconductor layer, a second layer having an outermost protective layer, and a plurality of element regions, and a plurality of first and second streets crossing each other to define each of the element regions;

a laser scribing step for radiating a laser beam to the first side along the first and second streets to form a plurality of first and second grooves along the streets, the first and second grooves being shallower than a thickness of the substrate;

after the laser scribing step, a plasma dicing step for etching the rest of the substrate remaining in a direction of a depth along the first and second grooves through the substrate by a plasma exposure to the grooves to dice the substrate into a plurality of element chips each having the element region;

wherein the laser scribing step includes, a first shallow-groove formation step for radiating the laser beam $N_1$ times ($N_1 \geq 1$) onto the first streets to form first shallow grooves each shallower than the first groove;

after the first shallow-groove formation step, a second shallow-groove formation step for radiating the laser beam $M_1$ times ($M_1 \geq 1$) onto the second streets to form second shallow grooves each shallower than the second groove;

after the second shallow-groove formation step, a second groove formation step for radiating the laser beam $M_2$ times ($M_2 \geq 1$) onto the second shallow grooves until the second grooves are formed; and after the first shallow-groove formation step, and after the second shallow-groove formation step or the second groove formation step, a first groove formation step for radiating the laser beam $N_2$ times ($N_2 \geq 1$) onto the first shallow grooves until the first grooves are formed.

2. The manufacturing process according to claim 1, wherein the first shallow grooves have a depth of 50% or more of that of the first grooves.

3. The manufacturing process according to claim 1, wherein $N_2$ equals to one.

4. The manufacturing process according to claim 1, wherein $M_2$ equals to one.

5. The manufacturing process according to claim 1, wherein $N_1$ equals to two or more and the first shallow-groove formation steps are made in series, and wherein the sum of $M_1$ and $M_2$ is two or more and the second shallow-groove formation step and the second groove formation step are made in series.

6. A manufacturing process of an element chip, comprising:
- a preparation step for preparing a substrate having first and second sides, the substrate including first and second streets crossing each other to define a plurality of element regions on the first side;
- a first shallow-groove formation step for radiating a laser beam along the first streets to form a plurality of first shallow grooves, the first shallow grooves being shallower than a thickness of the substrate;
- a second shallow-groove formation step for radiating the laser beam along the second streets to form a plurality of second shallow grooves, the second shallow grooves being shallower than a thickness of the substrate;
- a first groove formation step for radiating the laser beam along the first shallow grooves to form a plurality of first grooves; and
- a plasma dicing step for etching the substrate along the first grooves and the second shallow grooves by a plasma exposure to dice the substrate into a plurality of element chips each having the element region.

7. The manufacturing process according to claim 6, further comprising a second groove formation step for radiating the laser beam along the second shallow grooves to form a plurality of second grooves.

8. The manufacturing process according to claim 7, the second shallow-groove formation step and the second groove formation step are made in series.

9. The manufacturing process according to claim 6, wherein at least either one of the first shallow-groove formation step and the second shallow-groove formation step is repeatedly made multiple times.

10. The manufacturing process according to claim 6, wherein the first shallow grooves have a depth of 50% or more of that of the first grooves.

11. A manufacturing process of an element chip, comprising:
- a preparation step for preparing a substrate having first and second sides, the substrate including first and second streets crossing each other to define a plurality of element regions on the first side;
- a first shallow-groove formation step for radiating a laser beam along the first streets to form a plurality of first shallow grooves, the first shallow grooves being shallower than a thickness of the substrate;
- a second shallow-groove formation step for radiating the laser beam along the second streets to form a plurality of second shallow grooves, the second shallow grooves being shallower than a thickness of the substrate;
- a second groove formation step for radiating the laser beam along the second shallow grooves to form a plurality of second grooves;
- a first groove formation step for radiating the laser beam along the first shallow grooves to form a plurality of first grooves; and
- a plasma dicing step for etching the substrate along the first grooves and the second grooves by a plasma exposure to dice the substrate into a plurality of element chips each having the element region.

12. The manufacturing process according to claim 11, wherein at least either one of the first shallow-groove formation step and the second shallow-groove formation step is repeatedly made multiple times.

13. The manufacturing process according to claim 11, the second shallow-groove formation step and the second groove formation step are made in series.

14. The manufacturing process according to claim 11, wherein the first shallow grooves have a depth of 50% or more of that of the first grooves.

* * * * *